United States Patent [19]

Nagashima

[11] Patent Number: 5,218,643
[45] Date of Patent: Jun. 8, 1993

[54] AUDIO SYSTEM FOR VEHICLE

[75] Inventor: Akira Nagashima, Saitama, Japan

[73] Assignee: Pioneer Electronic Corporation, Tokyo, Japan

[21] Appl. No.: 881,655

[22] Filed: May 12, 1992

[30] Foreign Application Priority Data

Oct. 29, 1991 [JP] Japan ............................ 3-88730[U]

[51] Int. Cl.⁵ ............................................. H03G 9/00
[52] U.S. Cl. ...................................... 381/86; 381/28; 381/102
[58] Field of Search .................. 381/86, 98, 102, 103, 381/28

[56] References Cited

U.S. PATENT DOCUMENTS

| | | | |
|---|---|---|---|
| 4,490,683 | 12/1984 | Rhee | 381/102 |
| 4,503,554 | 3/1985 | Davis | 381/28 |
| 4,622,691 | 11/1986 | Tokumo et al. | 381/86 |
| 4,648,117 | 3/1987 | Kunungi et al. | 381/86 |
| 4,759,065 | 7/1988 | Field et al. | 381/98 |
| 4,845,775 | 7/1989 | Kanagawa | 381/102 |
| 4,866,776 | 9/1989 | Kasai et al. | 381/86 |
| 5,046,106 | 9/1991 | Liebel et al. | 381/102 |

Primary Examiner—Forester W. Isen
Attorney, Agent, or Firm—Sughrue, Mion, Zinn, Macpeak & Seas

[57] ABSTRACT

An audio system for a vehicle wherein the feeling of a passenger on the rear seat of the vehicle in listening to sound can be improved only by operation of a sound volume switch of a manually operating section without the necessity of operation of any other switch. A microcomputer detects an attenuation amount from an operating section and outputs to an equalizer, when the attenuation amount is lower than a predetermined value, a medium and high frequency sound region controlling signal for attenuating sound in the medium and high frequency sound regions in a substantially inversely proportional relationship at least to the attenuation amount. A plurality of rear loudspeakers receive the medium and high frequency sound region controlling signal from the equalizer and output sound of an attenuation information signal wherein sound in the medium and high frequency sound regions is attenuated.

5 Claims, 9 Drawing Sheets

AUDIO SYSTEM FOR VEHICLE

BACKGROUND OF THE INVENTION

1. Field of the Invention

This invention relates to an audio system for a vehicle which is carried on a vehicle such as a passenger car to enjoy audio information such as music.

2. Description of the Prior Art

Audio systems for a vehicle normally include a plurality of front loudspeakers and a plurality of rear loudspeakers all of which have the same characteristics. In this instance, the sound field produced by the front and rear loudspeakers does not make a forwardly displaced sound field. The forwardly displaced sound field herein denotes a sound field in which the position at which sounds from the front and rear loudspeakers are heard equally loudly is displaced forwardly from a geographical central position among the front and rear loudspeakers to another position of or around a driver's seat of the vehicle.

However, in order to assure safe driving of a vehicle, an audio system for a vehicle is sometimes constructed such that a plurality of front loudspeakers produce sound in medium and high frequency sound regions and a plurality of rear loudspeakers produce sound in a low frequency sound region so as to make the sound field a forwardly displaced sound field.

Since the conventional audio systems for a vehicle are constructed in such a manner as described above, when the sound field is not a forwardly displaced sound field, various switches of an equalizer, a fader and so forth must be manually operated in accordance with the number and positions of passengers of the vehicle to adjust the sound field, which is a very cumbersome operation.

Further, if the sound volume is excessively great, then a passenger on the rear seat will feel sound in medium and high frequency sound regions disagreeable due to reflected sound from the rear windshield and so forth of the vehicle.

Meanwhile, when the sound field is a forwardly displaced sound field, if the sound volume is small, then a more effort will be required for a passenger on the rear sheet to listen to sound in medium and high frequency sound regions than another passenger on the front seat (driver's seat or assistant driver's seat) because the former passenger will listen to sound in medium and high frequency sound regions derived only from the front loudspeakers.

Then, if the sound volume is adjusted with reference to the rear seat, then the sound volume on the front seat will be excessively great.

It is to be noted that, due to structural characteristics of a vehicle, if a loudspeaker of a great diameter is employed as a front loudspeaker, then it is mounted either in the dashboard or in a door of the vehicle, and in this instance, when the sound volume is great, resonance will occur and cause distortion of sound. Accordingly, a front loudspeaker is not suitable for reproduction of low frequency sound of a great sound volume.

On the other hand, a rear loudspeaker is suitable for reproduction of low frequency sound because the trunk room of the vehicle can be used as a loudspeaker box therefor.

SUMMARY OF THE INVENTION

It is an object of the present invention to provide an audio system for a vehicle wherein the feeling of a passenger on the rear seat of the vehicle in listening to sound can be improved only by operation of a sound volume switch of a manually operating section without the necessity of operation of any other switch.

In order to attain the object, according to the present invention, there is provided an audio system for a vehicle, which comprises a signal source for outputting an information signal, an electronic volume for attenuating the information signal from the signal source in accordance with an attenuation signal and outputting an attenuation information signal obtained by the attenuation, a plurality of front loudspeakers for outputting sound of the attenuation information signal from the electronic volume, an equalizer for attenuating components for medium and high frequency sound regions of the attenuation information signal from the electronic volume in accordance with a medium and high frequency sound region controlling signal, a plurality of rear loudspeakers for outputting sound of the attenuation information signal from the equalizer, operating means for manually designating an attenuation amount, and controlling means for detecting an attenuation amount from the operating means to output an attenuation signal to the electronic volume and for outputting to the equalizer, when the attenuation amount from the operating means is lower than a predetermined value, a medium and high frequency sound region controlling signal for attenuating sound in the medium and high frequecy sound regions in a substantially inversely proportional relationship to the attenuation amount. Preferably, the controlling means detects an attenuation amount from the operating means to output an attenuation signal to the electronic volume and outputs to the equalizer, in response to the attenuation amount, a medium and high frequency sound region controlling signal for varying at least the cut off frequency of the equalizer.

With the audio system for a vehicle, when the operating means is manually operated to designate an attenuation amount, if the attenuation amount is lower than the predetermined value, then audio information wherein sound of the medium and high frequency sound regions is attenuated is produced from the rear loudspeakers, or audio information wherein at least the cut off frequency of the equalizer is varied in accordance with the attenuation amount is produced from the rear loudspeakers.

Accordingly, only if a sound volume switch of the operating means is manually operated, then the feeling in listening to sound on the rear seat can be improved without the necessity of manually operating any other switch.

The above and other objects, features and advantages of the present invention will become apparent from the following description and the appended claims, taken in conjunction with the accompanying drawings in which like parts or elements are denoted by like reference characters.

DESCRIPTION OF THE PREFERRED EMBODIMENTS

Figure 1:
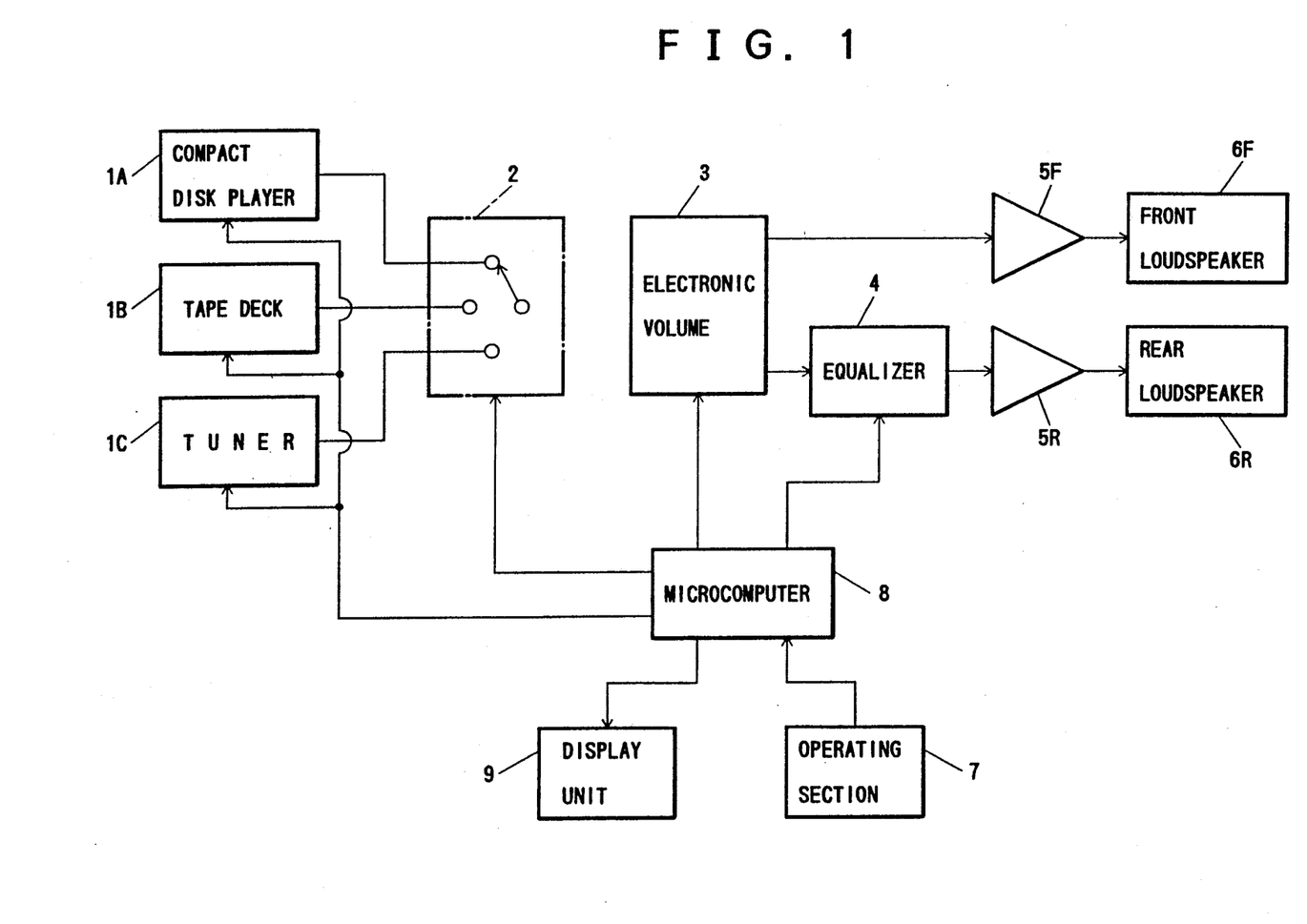
FIG. 1 is a block diagram of an audio system for a vehicle showing a preferred embodiment of the present invention.

Referring first to FIG. 1, there is shown an audio system for a vehicle according to a first preferred embodiment of the present invention. The audio system for a vehicle shown includes a compact disk player 1A serving as a signal source for outputting an information signal, a tape deck 1B serving as another signal source for outputting another information signal, and a tuner 1C serving as a further signal source for outputting a further information signal. The compact disk player 1A, tape deck 1B and tuner 1C operate in accordance with operation controlling signals from a microcomputer 8 which will be hereinafter described.

The audio system for a vehicle further includes a signal source selecting section 2 which is controlled by the microcomputer 8 to select one of the compact disk player 1A, tape deck 1B and tuner 1C.

The audio system for a vehicle further includes an electronic volume 3 which attenuates an information signal supplied thereto from the signal source selecting section 2 in accordance with an attenuation signal from the microcomputer 8 and outputs an attenuation information signal obtained by such attenuation.

Though not shown, the electronic volume 3 includes a roundness control, a tone control and a fader therein.

The audio system for a vehicle further includes an equalizer 4 which attenuates signal components for medium and high frequency sound regions of an attenuation information signal from the electronic volume 3 in accordance with a medium and high frequency sound region controlling signal from the microcomputer 8 and outputs an attenuation information signal obtained by the attenuation.

The audio system for a vehicle further includes a front amplifier 5F which amplifies an attenuation information signal from the electronic volume 3 and outputs a thus amplified attenuation information signal to a plurality of front loudspeakers 6F (only one is shown in FIG. 1), and a rear amplifier 5R which amplifies an attenuation information signal from the electronic volume 3 and outputs a thus amplified attenuation information signal to a plurality of rear loudspeakers 6R (only one is shown in FIG. 1).

The audio system for a vehicle further includes an operating section 7 for manually designating a variation of the attenuation amount of the electronic volume 3.

The microcomputer 8 serves as a controlling section and outputs a signal source selection signal in accordance with a signal source selection signal from the operating section 7. Further, the microcomputer 8 detects an attenuation amount designated by the operating section 7 and outputs a corresponding attenuation signal. Besides, the microcomputer 8 outputs, when the attenuation amount from the operating section 7 is lower than a predetermined value, a medium and high frequency sound region controlling signal for attenuating sound in the medium and high frequency sound regions in an inversely proportional relationship to the attenuation amount.

The audio system for a vehicle further includes a display unit 9 for displaying various information thereon in response to a signal from the microcomputer 8.

Though not shown, the electronic volume 3 has a total of 11 positions or steps 0, 1, 2, 3, 4, 5, 6, 7, 8, 9 and 10, and the sound volume to be controlled by the electronic volume 3 increases in this order. Subsequently, operation of the audio system for a vehicle will be described with a predetermined value of the attenuation amount set to 6.

In particular, the operating section 7 will first be operated manually by a passenger such as a driver of the vehicle, in which the audio system for a vehicle is incorporated, to select, for example, the compact disk player 1A. In response to the operation, the microcomputer 8 controls the signal source selecting section 2 to select the compact disk player 1A.

Then, the passenger will manually operate the operating section 7 to perform reproduction of music information. Thus, referring to FIG. 2, in response to the operation, the microcomputer 8 sets the step N of the electronic volume 3 to 0 at step ST1 and then judges, at step ST2, whether or not the attenuation amount has been decreased, that is, whether or not the step N has been increased. Then, in case the step N has been increased, the microcomputer 8 judges at step ST3 whether or not the step N is equal to 10.

Figure 2:
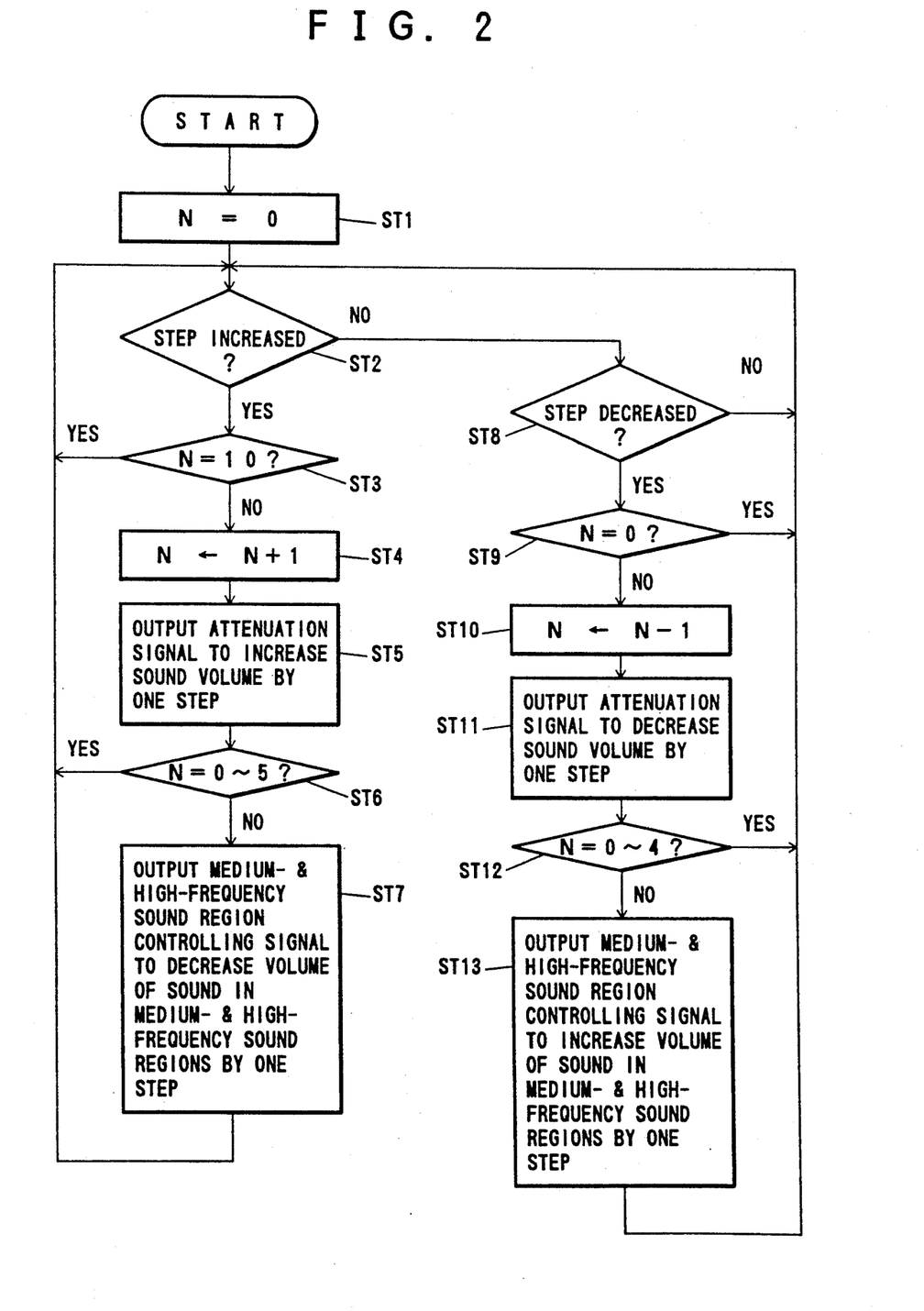
FIG. 2 is a flow chart illustrating operation of the audio system for a vehicle of FIG. 1.

If it is judged at step ST3 that the step N is equal to 10, then the control sequence returns to step ST2, but on the contrary if the step N is not equal to 10, that is, if the step N is equal to or lower than 9, then the step N is incremented by one at step ST4, and then a corresponding attenuation signal is outputted to the electronic volume 3 at step ST5. After then, the microcomputer 8 judges at step ST6 whether or not the step N is lower than a predetermined value, in this case, lower than 6, that is, whether or not the step N is equal to one of 0 to 5.

Then, if it is judged at step ST6 that the step N is equal to one of 0 to 5, then the control sequence returns to step ST2, but otherwise if the step N is equal to or higher than 6, then a medium and high frequency sound region controlling signal for decreasing the volume of sound in the medium and high frequency sound regions by one step is outputted to the equalizer 4 at step ST7, whereafter the control sequence returns to step ST2.

On the other hand, if it is judged at step ST2 that the step N has not been increased, then it is judged subsequently at step ST8 whether or not the step N has been decreased, and if the step N has not been decreased, then the control sequence returns to step ST2, but otherwise if the step N has been decreased, then it is judged subsequently at step ST9 whether or not the step N is equal to 0.

Then, if it is judged at step ST9 that the step N is equal to 0, then the control sequence returns to step ST2, but otherwise if the step N is not equal to 0, that is, if the step N is equal to or greater than 1, then the step N is decremented by one at step ST10 and then the microcomputer 8 outputs a corresponding attenuation signal to the electronic volume 3 at step ST11, whereafter it is judged at step ST12 whether or not the new step N after such decrementing at step ST11 is smaller than the predetermined value minus one, that is, whether or not the new step N is one of 0 to 4.

If it is judged at step ST12 that the step N is one of 0 to 4, then the control sequence returns to step ST2, but otherwise if the step N is equal to or greater than 5, then the microcomputer 8 outputs to the equalizer 4, at step ST13, a medium and high frequency sound region controlling signal for increasing the volume of sound in the medium and high frequency sound regions by one step, whereafter the control sequence returns to step ST2.

Figure 3:
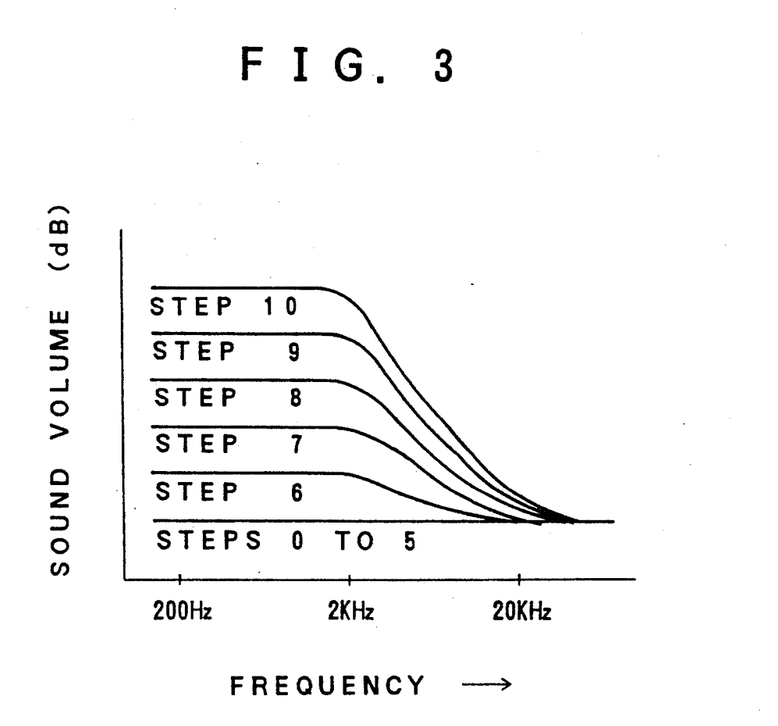
FIG. 3 is a diagram illustrating a relationship between a frequency and a sound volume for different steps of a rear side volume according to the audio system for a vehicle of FIG. 1.

The sound volume of information which is controlled by the microcomputer 8 and outputted from the rear loudspeakers 6R in this manner presents such a variation as shown in FIG. 3. Thus, when the sound volume is smaller than the predetermined value, 6 in this instance, the forward displacement of the sound field is cancelled, and consequently, sound information is supplied to the front and rear seats from the adjacent loudspeakers 6F and 6R, respectively. As a result, the feeling in listening to sound on the rear seat is improved.

Further, as the sound volume increases from the predetermined value equal to 6, the level of sound in the medium and high frequency sound regions from the rear loudspeakers 6R decreases in an inversely proportional relationship to the attenuation amount so that the sound field approaches a forwardly displaced sound field, which contributes to safe driving of the vehicle. Meanwhile, since the rate at which sound in the medium and high frequency sound regions is reflected by the rear windshield of the vehicle and comes to the rear seat decreases, also the feeling in listening to sound on the rear seat is improved.

Further, the improvement in feeling in listening to sound on the rear seat described above can be performed readily only by manual operation of the sound volume switch of the operating section 7 without manual operation of any other switch.

Figure 4:
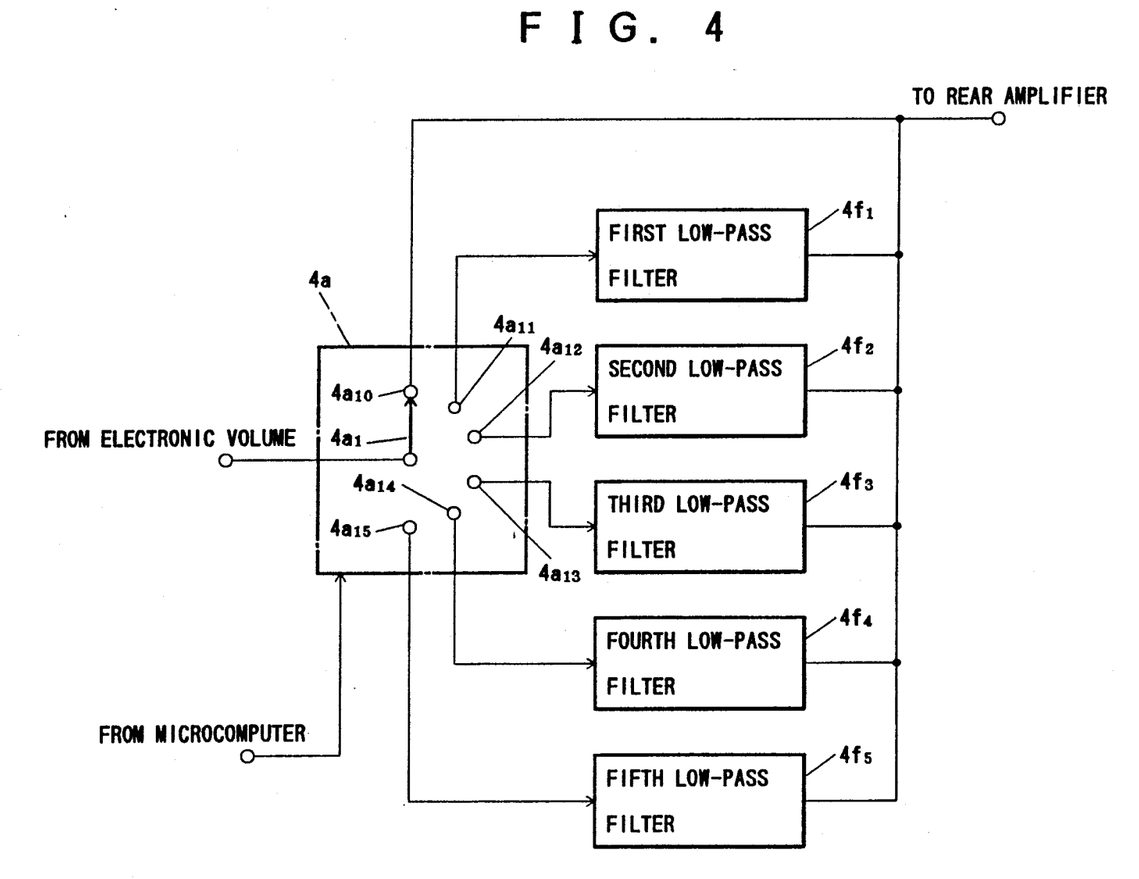
FIG. 4 is a block diagram of an equalizer is constituted from several low-pass filters.

Referring now to FIG. 4, there is shown a detailed construction of an equalizer which is constituted from several low-pass filters and can be incorporated into the audio system for a vehicle of FIG. 1 described above. The equalizer shown includes a switching section $4a$ having fixed contacts $4a_{10}$ to $4a_{15}$ and a movable contact $4a_1$ which is selectively connected to the fixed contacts $4a_{10}$ to $4a_{15}$ in response to a medium and high frequency sound region controlling signal from the microcomputer 8 to select one or none of first to fifth low-pass filters $4f_1$ to $4f_5$.

The first low-pass filter $4f_1$ is selected when the attenuation amount is equal to the step 6; the second low-pass filter $4f_2$ is selected when the attenuation amount is equal to the step 7; the third low-pass filter $4f_3$ is selected when the attenuation amount is equal to the step 8: the fourth low-pass filter $4f_4$ is selected when the attenuation amount is equal to the step 9: and the fifth low-pass filter $4f_5$ is selected when the attenuation amount is equal to the step 10.

Figure 5:
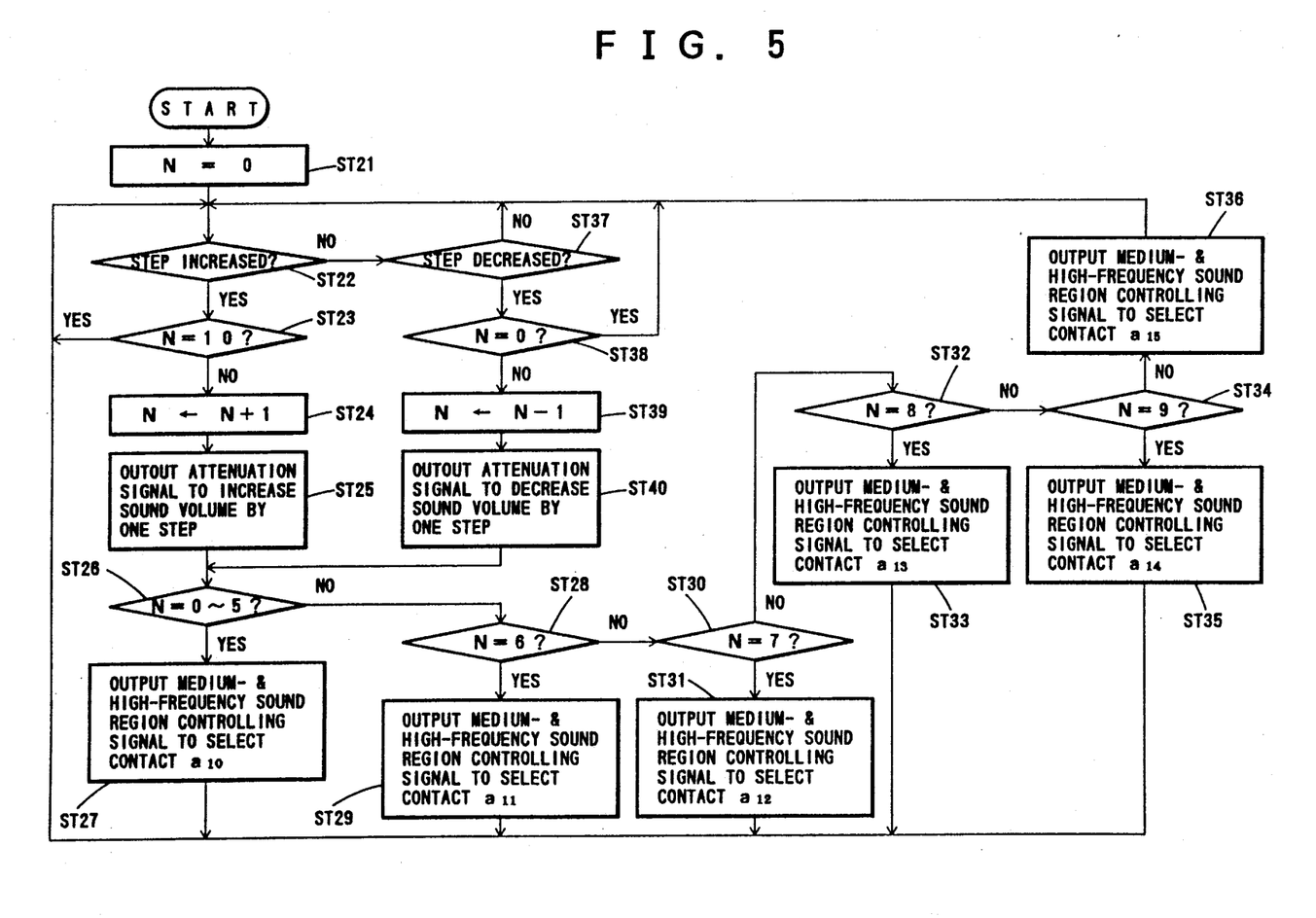
FIG. 5 is a flow chart illustrating different operation of the audio system for a vehicle of FIG. 1 in which the equalizer shown in FIG. 5 is incorporated.

Referring now to FIG. 5, there is illustrated operation of the audio system for a vehicle of FIG. 1 when the equalizer shown in FIG. 4 is incorporated therein. Also here, the sound volume to be controlled by the electronic volume 3 increases as the step varies in order of 0, 1, 2, 3, 4, 5, 6, 7, 8, 9 and 10, and the predetermined value of the attenuation amount is equal to the step 6.

In operation, the operating section 7 will first be operated manually by a passenger such as a driver of the vehicle, in which the audio system for a vehicle is incorporated, to select, for example, the compact disk player 1A. In response to the operation, the microcomputer 8 controls the signal source selecting section 2 to select the compact disk player 1A.

Then, the passenger will manually operate the operating section 7 to perform reproduction of music information. In response to the operation, the microcomputer 8 sets the step N of the electronic volume 3 to 0 at step ST21 and then judges, at step ST22, whether or not the attenuation amount has been decreased, that is, whether or not the step N has been increased. Then, in case the step N has been increased, the microcomputer 8 judges at step ST23 whether or not the step N is equal to 10.

If it is judged at step ST23 that the step N is equal to 10, then the control sequence returns to step ST22, but otherwise if the step N is not equal to 10, that is, if the step N is equal to or lower than 9, then the step N is incremented by one at step ST24, and then a corresponding attenuation signal is outputted to the electronic volume 3 at step ST25. After then, the microcomputer 8 judges at step ST26 whether or not the step N is lower than the predetermined value, in this case, lower than 6, that is, whether or not the step N is equal to one of 0 to 5.

Then, if it is judged at step ST26 that the step N is equal to one of 0 to 5, then the microcomputer 8 outputs to the equalizer 4, at step ST27, a medium and high frequency sound region controlling signal to instruct the switching section $4a$ (FIG. 4) to select the contact $4a_{10}$, whereafter the control sequence returns to step ST22.

On the other hand, it it is judged at step ST26 that the step N is not equal to any one of 0 to 5, that is, the step N is equal to or higher than 6, then the microcomputer 8 judges at step ST28 whether or not the step N is equal to 6, and if the step N is equal to 6, then the microcomputer 8 outputs to the equalizer 4, at step ST29, a medium and high frequency sound region controlling signal to instruct the switching section $4a$ to select the contact $4a_{11}$, whereafter the control sequence returns to step 22.

If it is judged at step ST28 that the step N is not equal to 6, then it is judged at step ST30 whether or not the step N is equal to 7, and if the step N is equal to 7, then the microcomputer 8 outputs to the equalizer 4, at step ST31, a medium and high frequency sound region controlling signal to instruct the switching section $4a$ to select the contact $4a_{12}$, whereafter the control sequence returns to step ST22.

In case it is judged at step ST30 that the step N is not equal to 7, it is subsequently judged at step ST32 whether or not the step N is equal to 8, and if the step N is equal to 8, then the microcomputer 8 outputs to the equalizer 4, at step ST33, a medium and high frequency sound region controlling signal to instruct the switching section 4a to select the contact 4a₁₃, whereafter the control sequence returns to step ST22.

If it is judged at step ST32 that the step N is not equal to 8, then it is judged at step ST34 whether or not the step N is equal to 9, and if the step N is equal to 9, then the microcomputer 8 outputs to the equalizer 4, at step ST35, a medium and high frequency sound region controlling signal to instruct the switching section 4a to select the contact 4a₁₄, whereafter the control sequence returns to step ST22.

If it is judged at step ST34 that the step N is not equal to 9, then the microcomputer 8 outputs to the equalizer 4, at step ST36, a medium and high frequency sound region controlling signal to instruct the switching section 4a to select the contact 4a₁₅, whereafter the control sequence returns to step ST22.

On the other hand, if it is judged at step ST22 that the step N has not been increased, then it is judged subsequently at step ST37 whether or not the step N has been decreased, and if the step N has not been decreased, then the control sequence returns to step ST22, but otherwise if the step N has been decreased, then it is judged at step ST38 whether or not the step N is equal to 0.

Then, if it is judged at step ST38 that the step N is equal to 0, then the control sequence returns to step ST22, but otherwise if the step N is not equal to 0, that is, if the step N is equal to or greater than 1, then the step N is decremented by one at step ST39 and then the microcomputer 8 outputs a corresponding attenuation signal to the electronic volume 3 at step ST40, whereafter the control sequence advances to step ST26.

Figure 6:
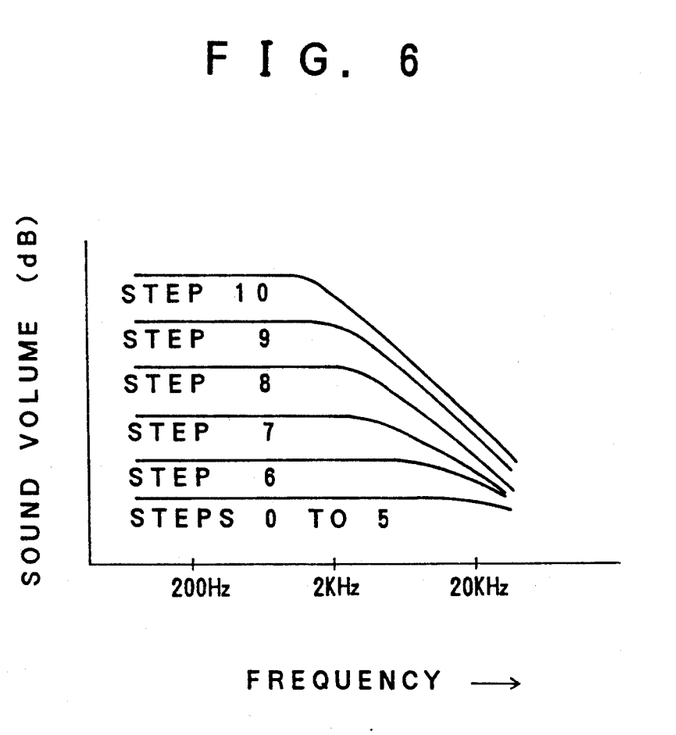
FIG. 6 is a diagram illustrating a relationship between a frequency and a sound volume for different steps of the rear side volume according to the audio system for a vehicle of FIG. 1 in which the equalizer shown in FIG. 5 is incorporated.

The sound volume of information which is controlled by the microcomputer 8 and outputted from the rear loudspeakers 6R in this manner presents such a variation as shown in FIG. 6. Consequently, such effects as described above are achieved.

Figure 7:
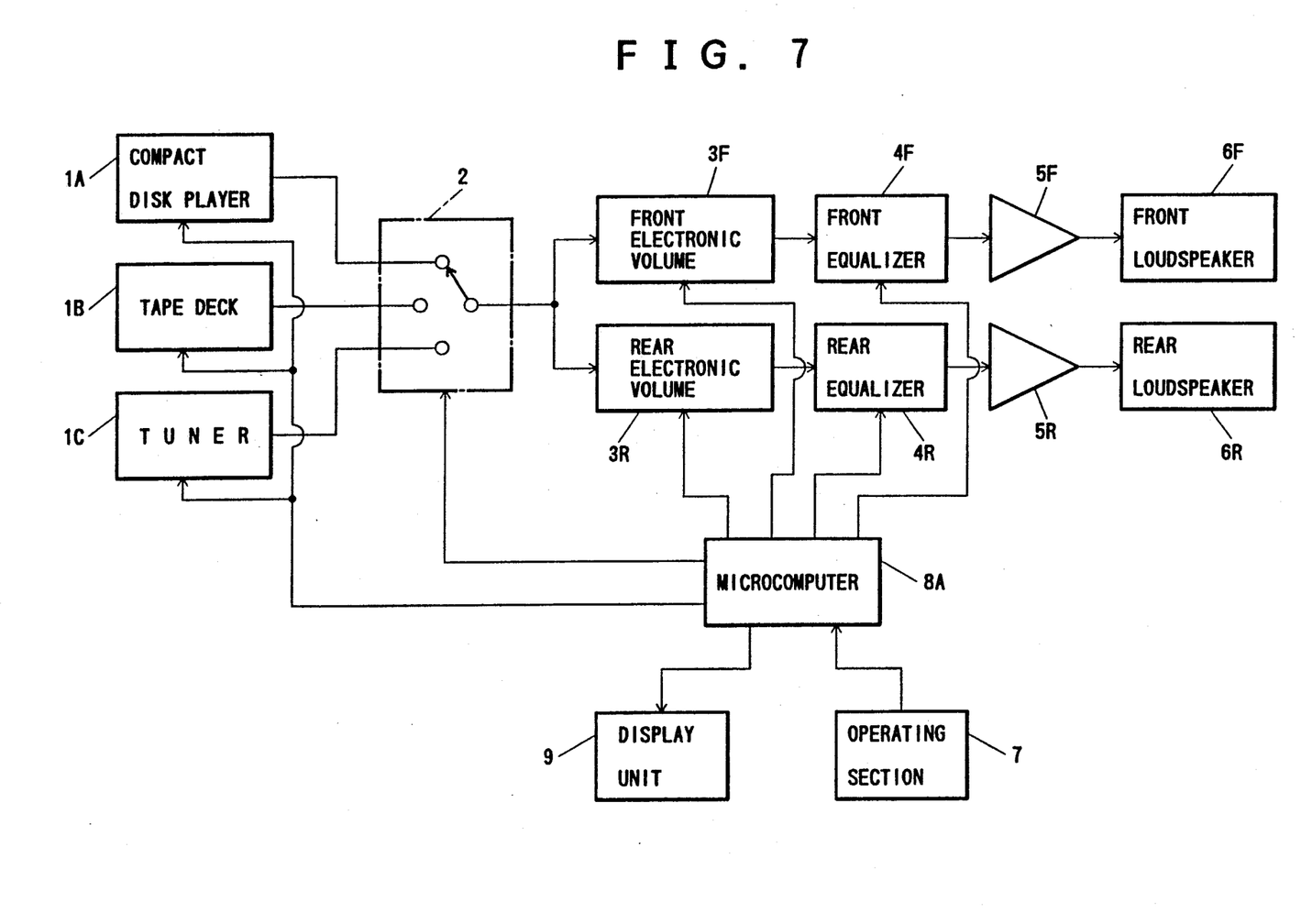
FIG. 7 is a block diagram of another audio system for a vehicle to which the present invention is applied.

Referring now to FIG. 7, there is shown another audio apparatus for a vehicle to which the present invention is applied. The present audio apparatus for a vehicle is a modification to the audio apparatus for a vehicle of FIG. 1 and is different only in that it includes a pair of front and rear electronic volumes 3F and 3R and a pair of front and rear equalizers 4F and 4R in place of the single electronic volume 3 and the single equalizer 4, respectively, of the audio apparatus for a vehicle of FIG. 1 and includes a modified microcomputer 8A in place of the microcomputer 8.

In particular, the front electronic volume 3F attenuates a front information signal supplied thereto from the signal source selecting section 2 in accordance with a front attenuation signal from the microcomputer 8A and outputs a front attenuation information signal obtained by such attenuation.

The rear electronic volume 3R attenuates a rear information signal supplied thereto from the signal source selecting section 2 in accordance with a rear attenuation signal from the microcomputer 8A and outputs a rear attenuation information signal obtained by such attenuation.

The front equalizer 4F attenuates a front attenuation information signal from the front electronic volume 3F in accordance with a low frequency sound region controlling signal from the microcomputer 8A and outputs an attenuation information signal obtained by the attenuation.

The rear equalizer 4R attenuates a rear attenuation information signal from the rear electronic volume 3R in accordance with a medium and high frequency sound region controlling signal from the microcomputer 8A and outputs the attenuation information signal obtained by the attenuation.

The microcomputer 8A serves as a controlling section and outputs a signal source selection signal in accordance with a signal source selection signal from the operating section 7. Further, the microcomputer 8A detects an attenuation amount designated by the operating section 7 and outputs a corresponding attenuation signal. Besides, the microcomputer 8A outputs, when the attenuation amount is lower than a predetermined value, a low frequency sound region controlling signal for attenuating sound in the low frequency sound region in an inversely proportional relationship to the attenuation amount as well as a medium and high frequency sound region controlling signal for attenuating sounds in the medium and high frequency sound regions in an inversely proportional relationship to the attenuation amount.

While description of operation of the present audio system for a vehicle is omitted herein, similar effects to those of the audio system for a vehicle of FIG. 1 are achieved with the audio system for a vehicle.

In addition, with the present audio system for a vehicle, when the attenuation amount is lower than the predetermined value, sound in the medium and high frequency sound regions is outputted from the front loudspeakers 6F while sound in the low frequency sound region is outputted from the rear loudspeakers 6R, and consequently, the sound field can be set substantially to a forwardly displaced sound field.

Further, when the attenuation amount is lower than the predetermined value, the level of sound in the low frequency sound region of the front loudspeakers 6F is lowered, and consequently, distortion of the sound by resonance can be prevented.

It is to be noted that, in the present audio system for a vehicle, the positional relationship between the front electronic volume 3F and the front equalizer 4F or/and the positional relationship between the rear electronic volume 3R and the rear equalizer 4R may be reversed alternatively.

Figure 8:
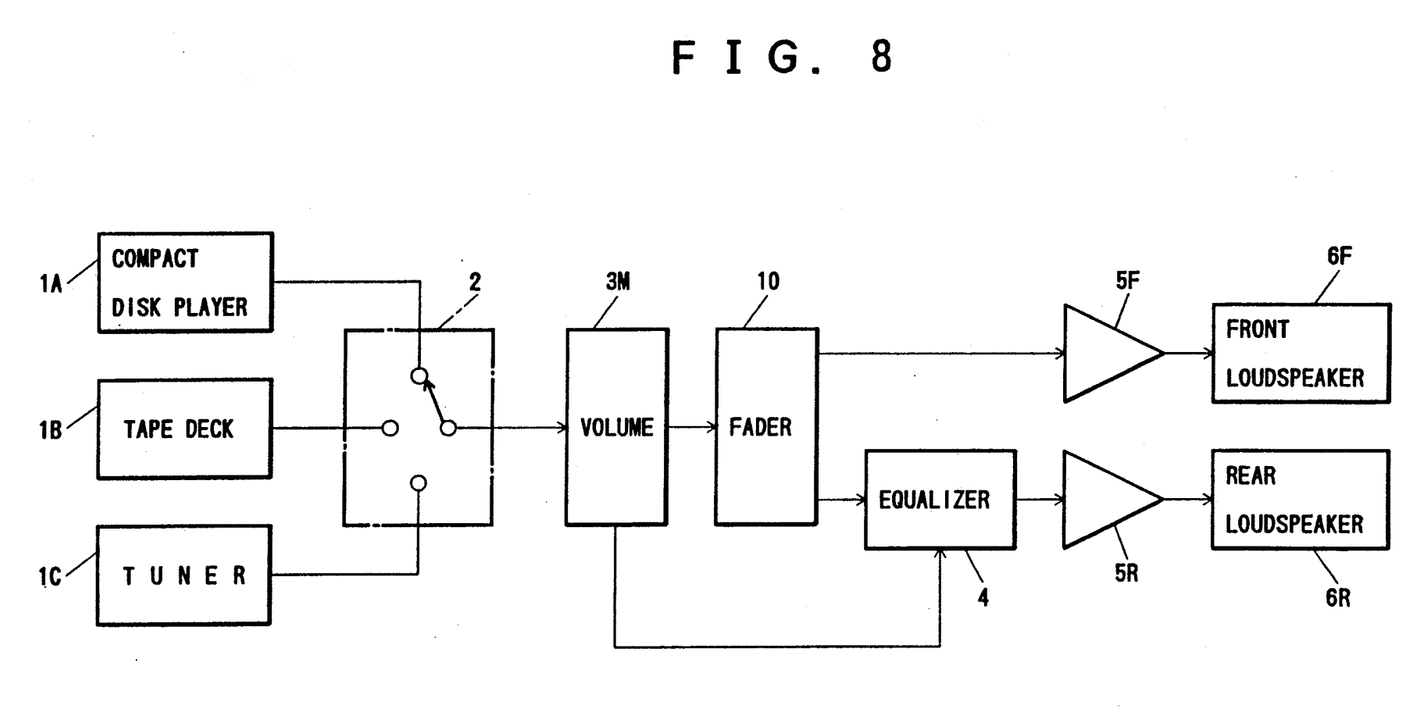
FIG. 8 is a block diagram of a further audio system for a vehicle to which the present invention is applied.

Referring now to FIG. 8, there is shown a further audio apparatus for a vehicle to which the present invention is applied. The present audio apparatus for a vehicle is another modification to the audio apparatus for a vehicle of FIG. 1 and is different only in that it includes a manually operable volume 3M in place of the electronic volume 3 of the audio apparatus for a vehicle of FIG. 1 and additionally includes a fader 10, and the equalizer 4 is operatively connected to the volume 3M. It is to be noted that, though not shown, a controlling section is connected to control the compact disk player 1A, tape deck 1B, tuner 1C and signal source selecting section 2 similarly as in the audio apparatus for a vehicle of FIGS. 1 and 7.

Figure 9:
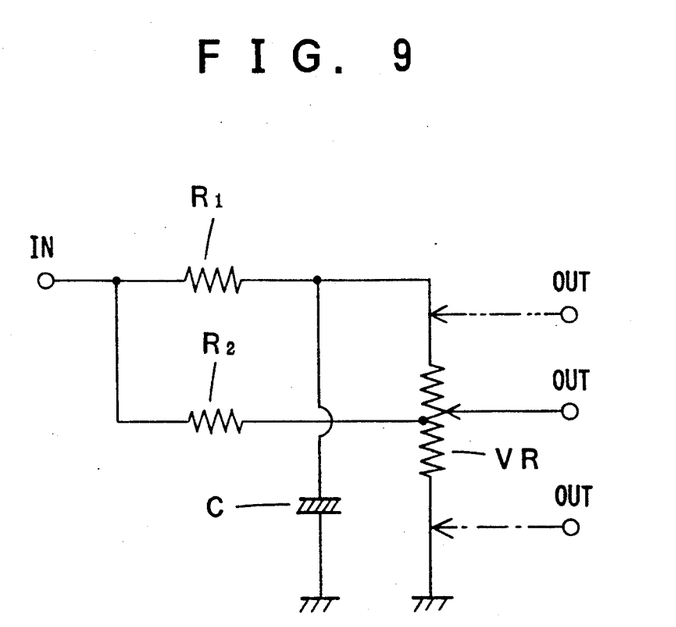
FIG. 9 is a circuit diagram showing details of an equalizer of the audio system for a vehicle of FIG. 8.

Referring now to FIG. 9, the volume 3M and equalizer 4 of FIG. 8 are shown more in detail. The circuit shown in FIG. 9 includes a first resistor $R_1$, and a second resistor $R_2$ having an end connected to an input side end of the first resistor $R_1$.

A variable resistor VR is connected at an end thereof to the other end of the first resistor $R_1$ and is grounded at the other end thereof, and the other end of the second resistor $R_2$ is connected to an intermediate portion or slider of the variable resistor VR.

A capacitor C is connected at an end thereof to a junction between the first resistor $R_1$ and the variable resistor VR and is grounded at the other end thereof. The capacitor C cooperates with the first resistor $R_1$ to constitute a low-pass filter.

If the volume 3M of the audio system for a vehicle constructed in this manner is adjusted to minimize the sound volume, then the slider of the variable resistor VR is positioned as shown by an alternate long and short dash line in FIG. 9. Consequently, the audio system for a vehicle will present a substantially flat characteristic.

On the other hand, if the volume 3 M is adjusted reversely to maximize the sound volume, then the slider of the variable resistor VR is positioned as shown by an alternate long and two-short dashes line in FIG. 9. Consequently, the audio system for a vehicle will present a different frequency characteristic wherein sound in the medium and high frequency sound regions decreases because the effect of the low-pass filter becomes high.

Accordingly, similar effects to those of the audio systems for a vehicle described hereinabove can be achieved.

It is to be noted that, in case the electronic volume 3 in the audio system for a vehicle of FIG. 1 is replaced by two electronic volumes as in the audio system for a vehicle of FIG. 7, similar effects can be achieved whether the equalizer 4 is disposed forwardly or rearwardly of the electronic volumes.

Further, while the audio systems for a vehicle are described to process an analog signal hereinabove, similar effects can be achieved also when they process a digital signal.

Having now fully described the invention, it will be apparent to one of ordinary skill in the art that many changes and modifications can be made thereto without departing from the spirit and scope of the invention as set forth herein.

What is claimed is:

1. An audio system for a vehicle, comprising:

a signal source for outputting an information signal;

an electronic volume for attenuating the information signal from said signal source in accordance with an attenuation signal and outputting an attenuation information signal obtained by the attenuation;

a plurality of front loudspeakers for outputting sound of the attenuation information signal from said electronic volume;

an equalizer for attenuating components for medium and high frequency sound regions of the attenuation information signal from said electronic volume in accordance with a medium and high frequency sound region controlling signal;

a plurality of rear loudspeakers for outputting sound of the attenuation information signal from said equalizer;

operating means for manually designating an attenuation amount; and controlling means for detecting an attenuation amount from said operating means to output an attenuation signal to said electronic volume and for outputting to said equalizer, when the attenuation amount from said operating means is lower than a predetermined value, a medium and high frequency sound region controlling signal for attenuating sound in the medium and high frequency sound regions in a substantially inversely proportional relationship to the attenuation amount.

2. An audio system for a vehicle as claimed in claim 1, wherein said controlling means detects an attenuation amount from said operating means to output an attenuation signal to said electronic volume and outputs to said equalizer, in response to the attenuation amount, a medium and high frequency sound region controlling signal for varying at least the cut off frequency of said equalizer.

3. An audio system for a vehicle as claimed in claim 2, wherein said equalizer includes a plurality of low-pass filters and switching means for selecting one of said low-pass filters.

4. An audio system for a vehicle as claimed in claim 1, wherein said electronic volume includes a front electronic volume and a rear electronic volume which attenuate the information signal from said signal source in accordance with a front attenuation signal and a rear attenuation signal, respectively, and output a front attenuation information signal and a rear attenuation information signal respectively, and said audio system for a vehicle further comprises a second equalizer for attenuating components for a low frequency sound region of the attenuation information signal from said front electronic volume in accordance with a low frequency sound region controlling signal and outputting the attenuated attenuation information signal to said front loudspeakers, said controlling means outputting to said second equalizer, when the attenuation amount from said operating means is lower than the predetermined value, a low frequency sound region controlling signal for attenuating sound in the low frequency sound region in a substantially inversely proportional relationship to the attenuation amount.

5. An audio system for a vehicle as claimed in claim 1, wherein said electronic volume is a manually adjustable volume and said equalizer is operatively coupled to said volume, and further comprising a fader connected to said volume such that the attenuation information signal from said volume is transmitted to said front loudspeakers and said equalizer.

* * * * *